United States Patent
Chang

(10) Patent No.: US 11,990,931 B2
(45) Date of Patent: May 21, 2024

(54) TRANSCEIVER AND CALIBRATION METHOD

(71) Applicant: Realtek Semiconductor Corporation, Hsinchu (TW)

(72) Inventor: Yi-Shao Chang, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 29 days.

(21) Appl. No.: 17/929,750

(22) Filed: Sep. 6, 2022

(65) Prior Publication Data

US 2023/0361801 A1 Nov. 9, 2023

(30) Foreign Application Priority Data

May 5, 2022 (TW) .................................. 111116975

(51) Int. Cl.
*H04B 1/40* (2015.01)
*H03H 11/04* (2006.01)
*H04B 17/11* (2015.01)

(52) U.S. Cl.
CPC .............. *H04B 1/40* (2013.01); *H03H 11/04* (2013.01); *H04B 17/11* (2015.01)

(58) Field of Classification Search
CPC .......... H04B 1/40; H04B 17/11; H04B 1/525; H04B 17/101; H04B 17/104; H03H 11/04; H04L 27/364; H03C 1/06
See application file for complete search history.

(56) References Cited

U.S. PATENT DOCUMENTS

| 5,796,817 A * | 8/1998 | Pozas Alvarez ...... H04M 1/654 379/384 |
| 2010/0195706 A1* | 8/2010 | Yanagisawa ........ H04L 27/2627 375/226 |
| 2011/0051843 A1* | 3/2011 | Otsuka ..................... H04B 1/30 455/114.2 |
| 2011/0092168 A1 | 4/2011 | Pan |

FOREIGN PATENT DOCUMENTS

| TW | 200536253 A | 11/2005 |
| TW | 200836494 A | 9/2008 |

\* cited by examiner

*Primary Examiner* — Sophia Vlahos
(74) *Attorney, Agent, or Firm* — CKC & Partners Co., LLC

(57) ABSTRACT

A transceiver includes a RF modulator, a filter circuit, a control circuit and a first DC offset compensation circuit. During a first calibration period, the control circuit controls the filter circuit to be connected to the RF modulator with a first phase sequence, such that the RF modulator outputs a first radio frequency signal. During a second calibration period, the control circuit controls the filter circuit to be connected to the RF modulator with a second phase sequence, such that the RF modulator outputs a second radio frequency signal. The second phase sequence is inverted with the first phase sequence. The control circuit is further configured to calculate a first DC offset generated from the filter circuit, and to control the first DC offset compensation circuit to compensate the first DC offset generated from the filter circuit.

20 Claims, 6 Drawing Sheets

TRANSCEIVER AND CALIBRATION METHOD

CROSS-REFERENCE TO RELATED APPLICATION

This application claims priority to Taiwan Application Serial Number 111116975, filed May 5, 2022, which is herein incorporated by reference in its entirety.

BACKGROUND

Field of Invention

The present invention relates to a transceiver. More particularly, the present invention relates to a transceiver and calibration method for DC offset compensation.

Description of Related Art

In nowadays wireless communication techniques, how to determine the DC offset of a transceiver is an important issue. Specifically, as the radiated power of the wireless communication increases, how to cancel DC offsets caused from each stage of circuit in a transceiver is important. However, DC offsets caused from each stage of circuit is hard to distinguish according to an output from the transceiver. Therefore, how to determine the DC offsets caused from each stage of circuit to cancel the DC offset accurately is an important issue in this field.

SUMMARY

To achieve the aforesaid purpose, one aspect of the present disclosure is related to a transceiver. The transceiver includes a RF modulator, a filter circuit, a control circuit and a first DC offset compensation circuit. The filter circuit is connected to the RF modulator with a phase sequence, and the RF modulator outputs a RF signal according to the phase sequence. The control circuit is connected to the RF modulator and the filter circuit. The control circuit is configured to perform the following steps. During a first calibration period, the control circuit controls the filter circuit to be connected to the RF modulator with a first phase sequence, and wherein in response to the filter circuit connected to the RF modulator with the first phase sequence, the RF modulator outputs a first RF signal. During a second calibration period, the control circuit controls the filter circuit to be connected to the RF modulator with a second phase sequence, and wherein in response to the filter circuit connected to the RF modulator with the second phase sequence, the RF modulator outputs a second RF signal. The control circuit calculates a first DC offset generated the filter circuit according to the first RF signal and the second RF signal. The first DC offset compensation circuit is connected to the filter circuit and the control circuit, and the control circuit is further configured to control the first DC offset compensation circuit to compensate the first DC offset generated from the filter circuit.

The other aspect of the present disclosure is related to a calibration method. The calibration method includes the following steps. During a first calibration period, a filter circuit is controlled to be connected to a RF modulator with a first phase sequence by a control circuit, and in response to the filter circuit to be connected to the RF modulator with the first phase sequence, outputting a first RF signal from the RF modulator. During a second calibration period, the filter circuit is controlled to be connected to the RF modulator with a second phase sequence by the control circuit, and in response to the filter circuit to be connected to the RF modulator with the second phase sequence, outputting a second RF signal from the RF modulator. A first DC offset generated from the filter circuit is calculated by the control circuit according to the first RF signal and the second RF signal. A first DC compensation circuit is controlled to compensate the first DC offset generated from the filter circuit by the control circuit.

Summary, the present disclosure utilizes the control circuit to control the filter circuit to be connected to the RF modulator with different phase sequences, such that the RF modulator generates the first RF signal at the first phase sequence and the second RF signal at the second phase which is inverted with the first phase sequence. The control circuit calculates a first DC offset generated from the filter circuit according to the first RF signal and the second RF signal, so as to compensate the first DC offset generated from the filter circuit.

BRIEF DESCRIPTION OF THE DRAWINGS

The present invention can be more fully understood by reading the following detailed description of the embodiment, with reference made to the accompanying drawings as follows.

DETAILED DESCRIPTION

Figure 1:
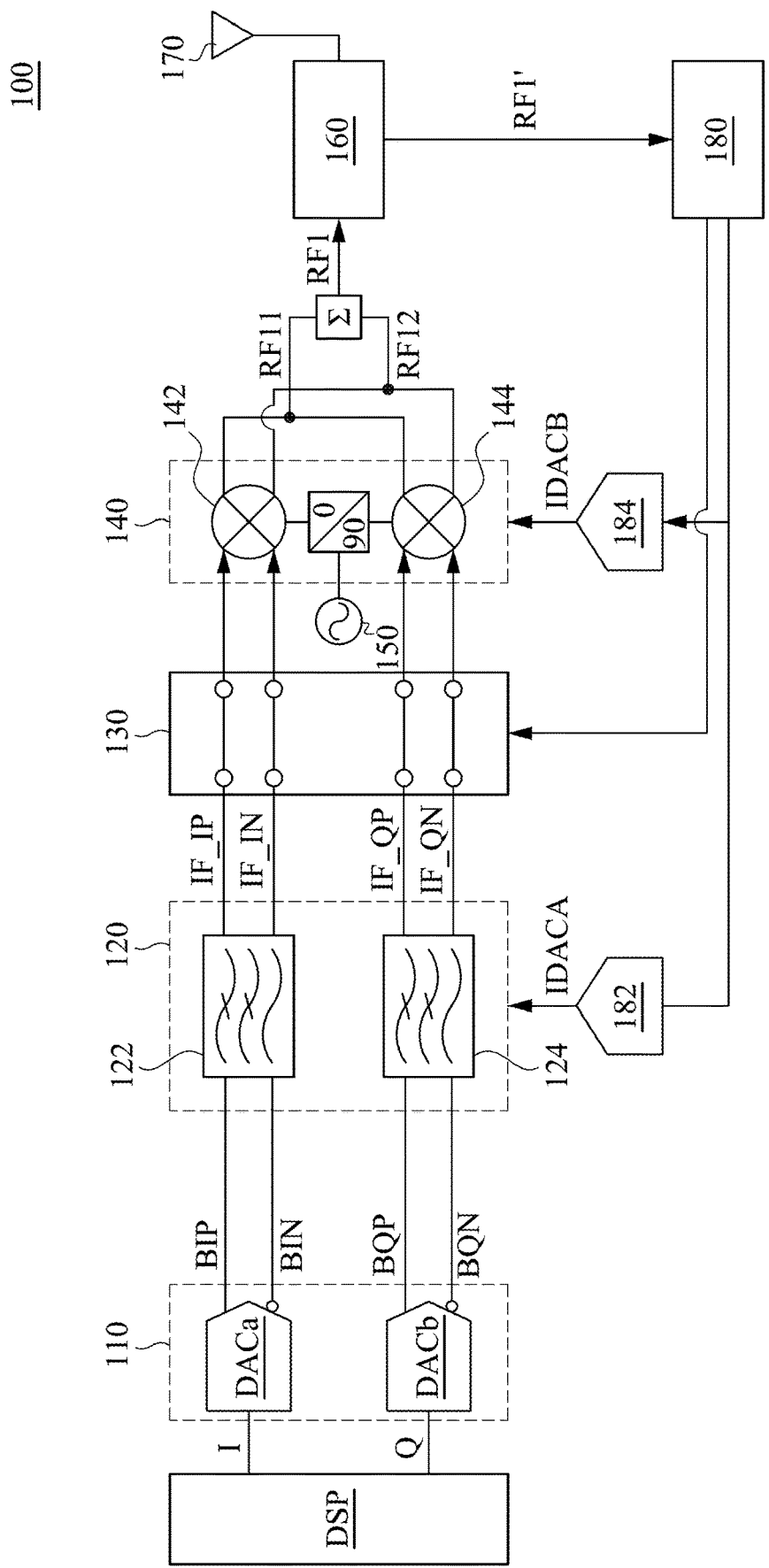
FIG. 1 is a schematic diagram of a transceiver in a normal mode and a first calibration period in accordance with one embodiment of the present disclosure.

Reference is made to FIG. 1. FIG. 1 is a schematic diagram of a transceiver 100 in a normal mode and a first calibration period in accordance with one embodiment of the present disclosure. As shown in FIG. 1, the transceiver 100 includes a digital signal processor DSP, a digital to analog converting circuit 110, a filter circuit 120, a switch circuit 130, a RF modulator 140, an amplifier 160, an antenna 170, a control circuit 180, a first DC compensation circuit 182 and a second DC compensation circuit 184. In structure, the filter circuit 120 is connected to the RF modulator 140 through the switch circuit 130, and the RF modulator 140 is connected to the antenna 170 through the amplifier 160. The control circuit 180 is connected to the switch circuit 130, the first DC compensation circuit 182, the second DC compensation circuit 184 and the amplifier 160.

The digital signal processor DSP is configured to generate an in-phase digital signal I and a quadrature digital signal Q to the digital to analog converters DACa and DACb included in the digital to analog converting circuit 110. The digital to analog converters DACa and DACb respectively convert the in-phase digital signal I and the quadrature digital signal Q to the analog signals BIP, BIN, BQP and BQN, and the digital to analog converters DACa and DACb output/transmit the analog signals BIP, BIN, BQP and BQN to the filters 122 and 124 included in the filter circuit 120. In some embodiments, the analog signals BIP, BIN, BQP and BQN can be considered as a positive in-phase base signal, a negative in-phase base signal, a positive quadrature base signal and a negative quadrature base signal, respectively.

The filter 122 generates a positive in-phase IF signal IF_IP according to the analog signal BIP converted from the in-phase digital signal I, and a positive in-phase terminal of the filter 122 outputs the positive in-phase IF signal IF_IP to a first input terminal of a mixer 142 included in the RF modulator 140. The filter 122 generates the negative in-phase IF signal IF_IN according to the analog signal BIN converted from the negative phase of the in-phase digital signal I, and a negative in-phase terminal of the filter 122 outputs the negative in-phase IF signal IF_IN to a second input terminal of a mixer 142 included in the RF modulator 140.

The filter 124 generates a positive quadrature IF signal IF_QP according to the quadrature digital signal Q converted from the analog signal BQP, and a positive quadrature terminal of the filter 124 outputs the positive quadrature IF signal IF_QP to a third input terminal of a mixer 144 included in the RF modulator 140. The filter 124 generates the negative quadrature IF signal IF_QN according to the quadrature digital signal Q converted from the negative phase of the analog signal BQN, and an negative quadrature terminal of the filter 124 outputs the negative quadrature IF signal IF_QN to a fourth input terminal of the mixer 144 included in the RF modulator 140.

The switch circuit 130 electrically coupled to between the filter circuit 120 and the RF modulator 140. The switch circuit 130 is configured to switch the electrical paths between the filter circuit 120 and the RF modulator 140, so as to connect the filter circuit 120 to the RF modulator 140 with different phase sequences.

For example, in some embodiments of FIG. 1, during the normal mode and the first calibration period, the switch circuit 130 connects the positive in-phase terminal of the filter circuit 120 to the first input terminal of the RF modulator 140, and connects the negative in-phase terminal of the filter circuit 120 to the second input terminal of the RF modulator 140, such that the mixer 142 converts the positive in-phase IF signal IF_IP and the negative in-phase IF signal IF_IN according to in-phase local oscillator signals provided by the local oscillator 150.

The switch circuit 130 connects the positive quadrature terminal of the filter circuit 120 to a third input terminal of the RF modulator 140, and connects the negative quadrature terminal of the filter circuit 120 to a fourth input terminal of the RF modulator 140, such that the mixer 144 converts the positive quadrature IF signal IF_QP and the negative quadrature IF signal IF_QN according to quadrature local oscillator signals provided by the local oscillator 150.

Therefore, during the normal mode and the first calibration period, the RF modulator 140 receive the positive in-phase IF signal IF_IP, the negative in-phase IF signal IF_IN, the positive quadrature IF signal IF_QP and the negative quadrature IF signal IF_QN with a first phase sequence of "positive, negative, positive, negative", so as to generate the first RF signals RF11 and RF12, and a sum of the first RF signals RF11 and RF12 forms a first RF signal RF1, the first RF signal RF1 transmitted through the amplifier 160 generates a the first RF signal RF1'. In some embodiments, the control circuit 180 read the first RF signal RF1' from the amplifier 160.

In some embodiments, the control circuit 180 includes a detection circuit (not shown), so as to detects the first RF signal RF1' from the amplifier 160. The control circuit 180 determines the first DC offset generated from the filter circuit 120 and the second DC offset generated from the RF modulator 140 according to the outputs (such as, one of the outputs can be considered as the first RF signal RF1') of the RF modulator 140 under the different phase sequences. How to determine the first DC offset generated from the filter circuit 120 and the second DC offset generated from the RF modulator 140, so as to control the first DC compensation circuit 182 and the second DC compensation circuit 184 to generate the compensation currents IDCA and IDACB, correspondingly, will be description in detailed in the following embodiments.

Figure 2:
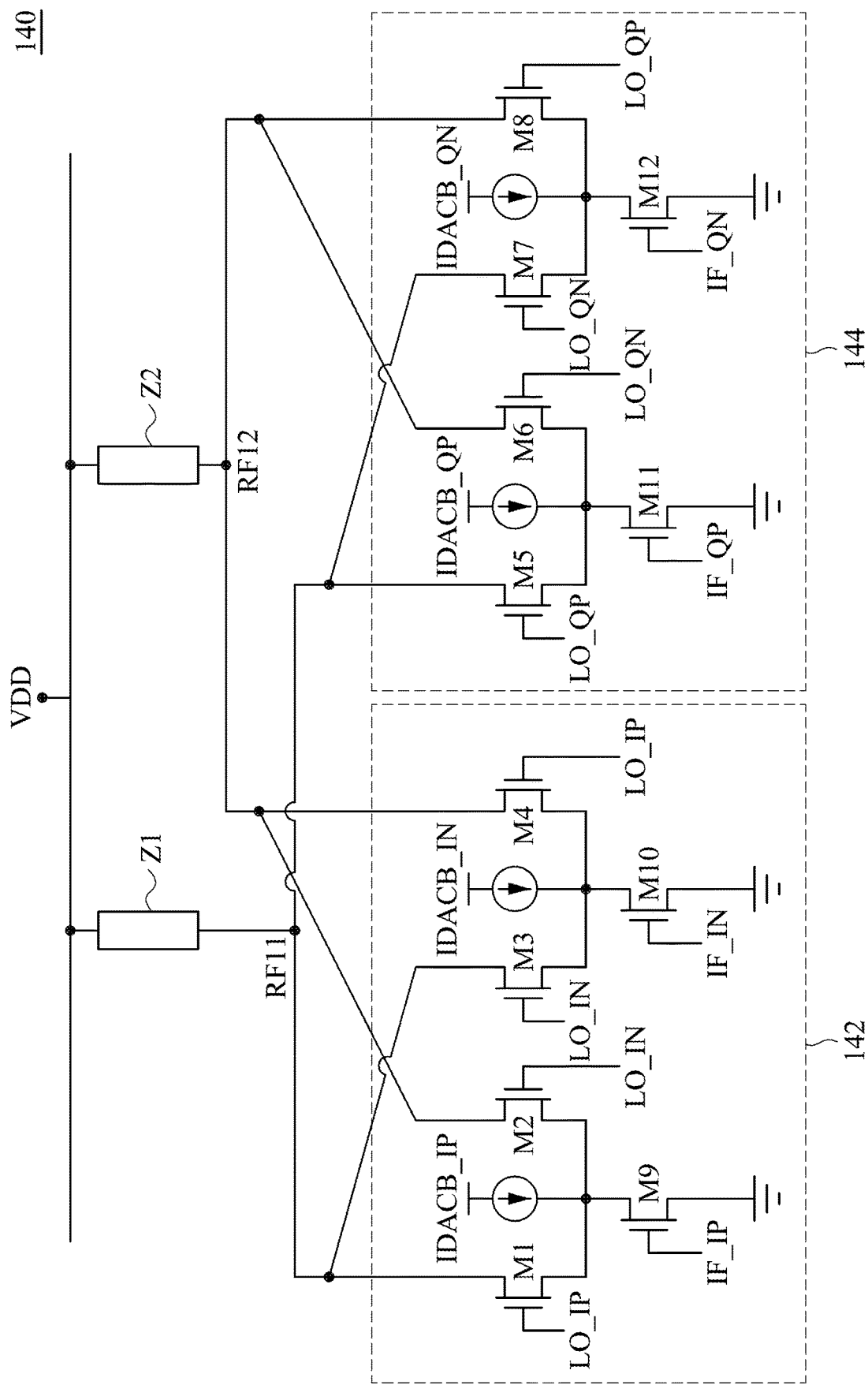
FIG. 2 is a schematic diagram of a RF modulator in the normal mode and the first calibration period in accordance with one embodiment of the present disclosure.

Reference is made to FIG. 2. FIG. 2 is a schematic diagram of a RF modulator 140 in the normal mode and the first calibration period in accordance with one embodiment of the present disclosure. As shown in FIG. 2, the RF modulator 140 includes components Z1 and Z2 and mixers 142 and 144. The component Z1 is electrically coupled between the system voltage terminal VDD and an output terminal of the first RF signal RF11. The component Z2 is electrically coupled between the system voltage terminal VDD and an output terminal of the first RF signal RF12. In some embodiments, the components Z1 and Z2 can be implemented by impedance component, such as, resistor, capacitor or a combination of the above elements.

An immediately frequency (IF) input stage of the mixer 142 consists of the transistors M9 and M10. The transistors M9-M10 are respectively receive the positive in-phase IF signal IF_IP and the negative in-phase IF signal IF_IN. The radio frequency (RF) output stage of the mixer 142 consists of the transistors M1-M4. The transistors M1-M4 are respectively receive the positive in-phase local oscillation signal LO_IP, the negative in-phase local oscillation signal LO_IN, the negative in-phase local oscillation signal LO_IN and the positive in-phase local oscillation signal LO_IP provided by the local oscillator 150.

Similarly, an IF input stage of the mixer 144 consists of the transistors M11 and M12. The transistors M11 and M12 are respectively receive the positive quadrature IF signal IF_IP and the negative quadrature IF signal IF_IN. A RF output stage of the mixer 144 consists of the transistors M5-M8. The transistors M5-M8 are respectively receive the positive quadrature local oscillation signal LO_QP, the negative quadrature local oscillation signal LO_QN, the negative quadrature local oscillation signal LO_QN and the positive quadrature local oscillation signal LO_QP provided by the local oscillator 150.

Figure 3A:
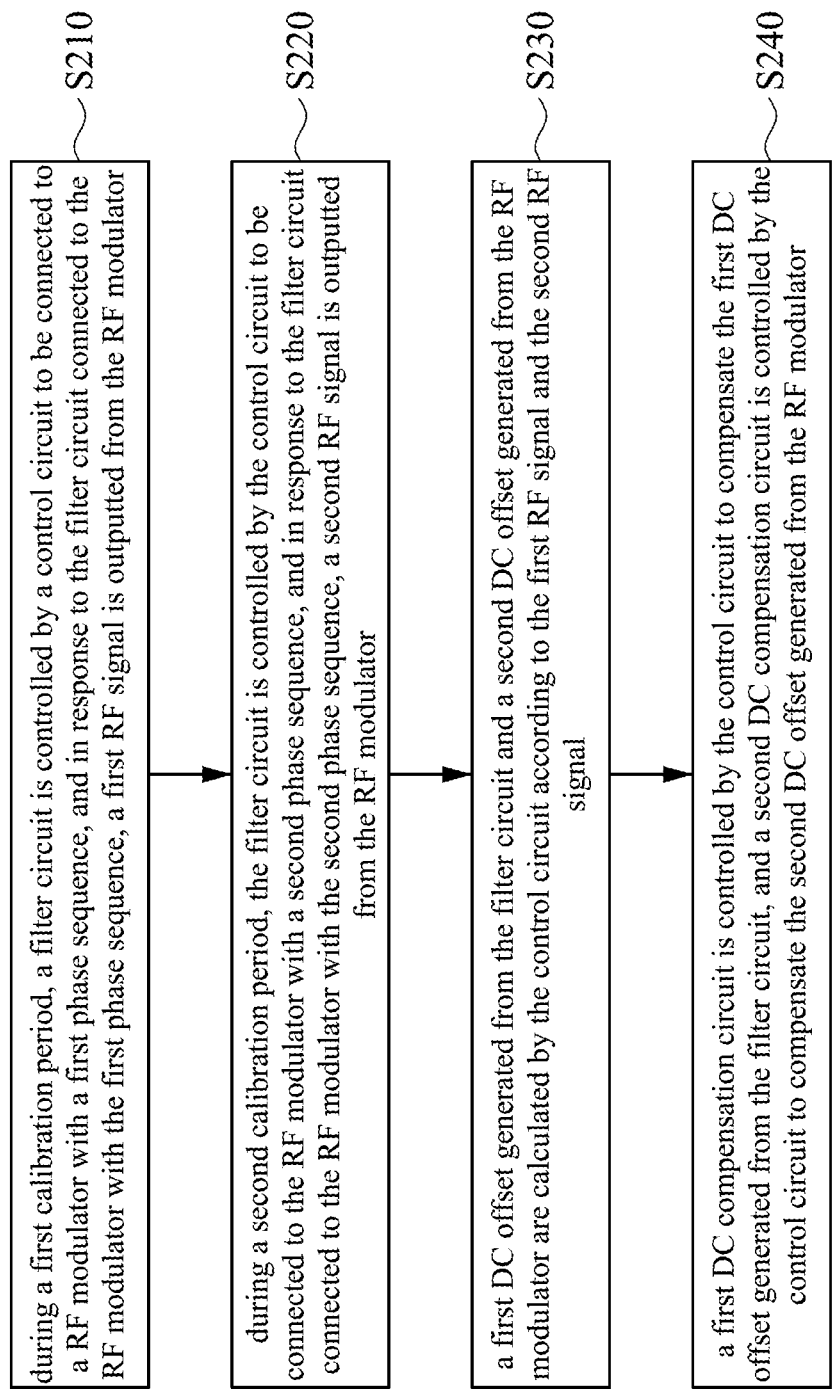
FIG. 3A is a schematic diagram of a flow chart of a calibration method in accordance with one embodiment of the present disclosure.
Figure 3B:
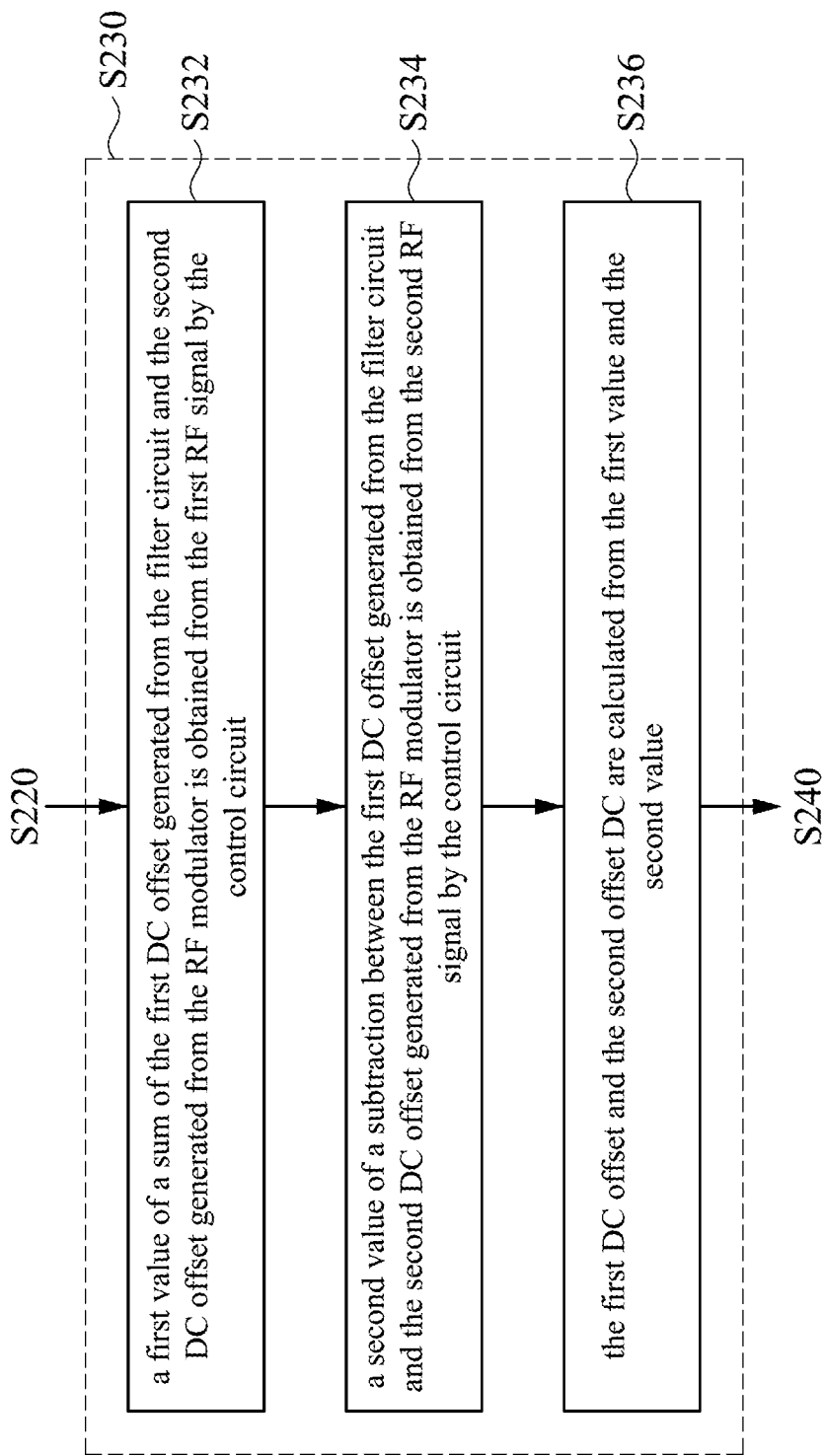
FIG. 3B is a schematic diagram of a flow chart of a step S230 of the calibration method in FIG. 3A in accordance with one embodiment of the present disclosure.
Figure 4:
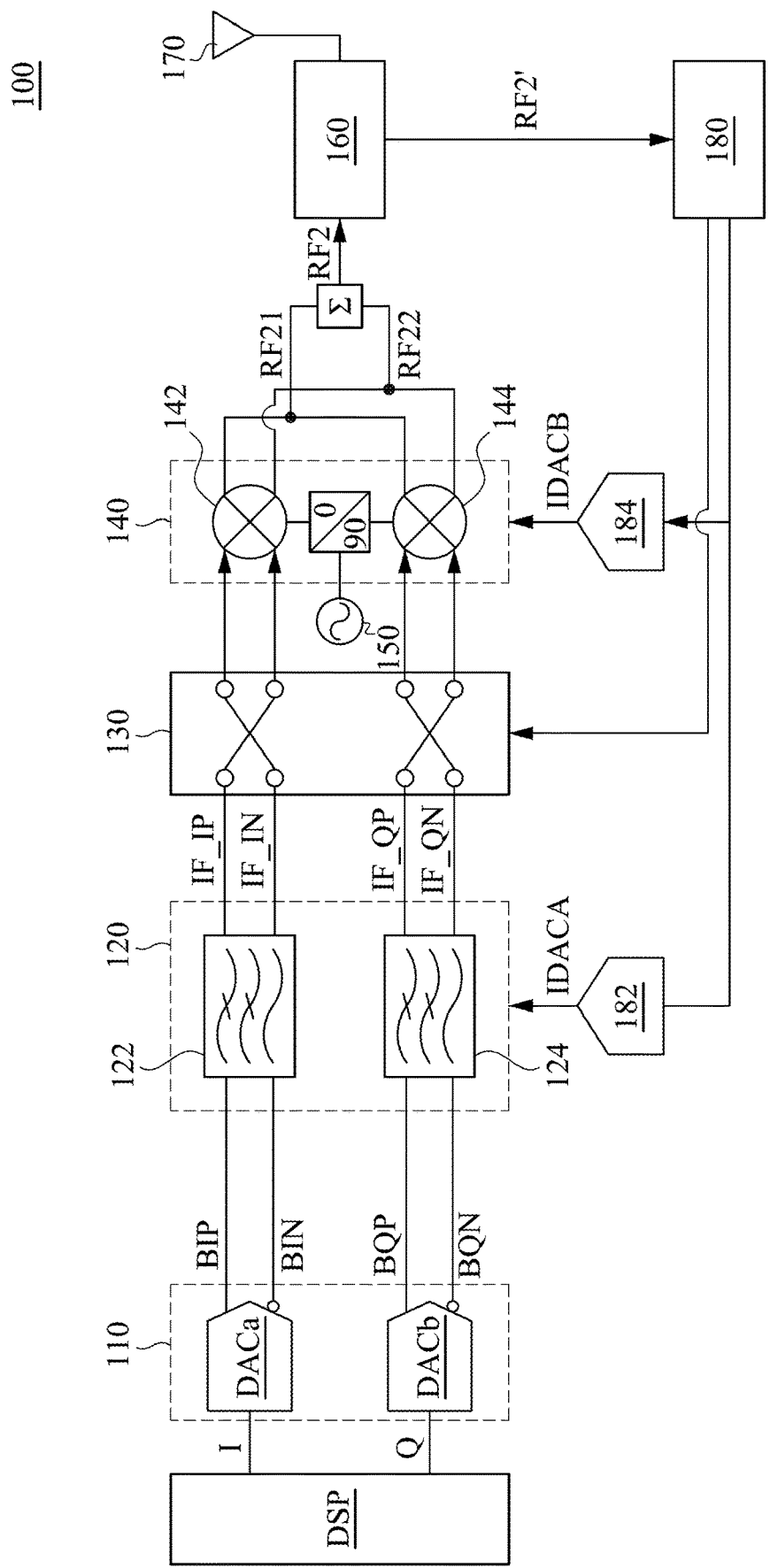
FIG. 4 is a schematic diagram of the transceiver in a second calibration period in accordance with one embodiment of the present disclosure.
Figure 5:
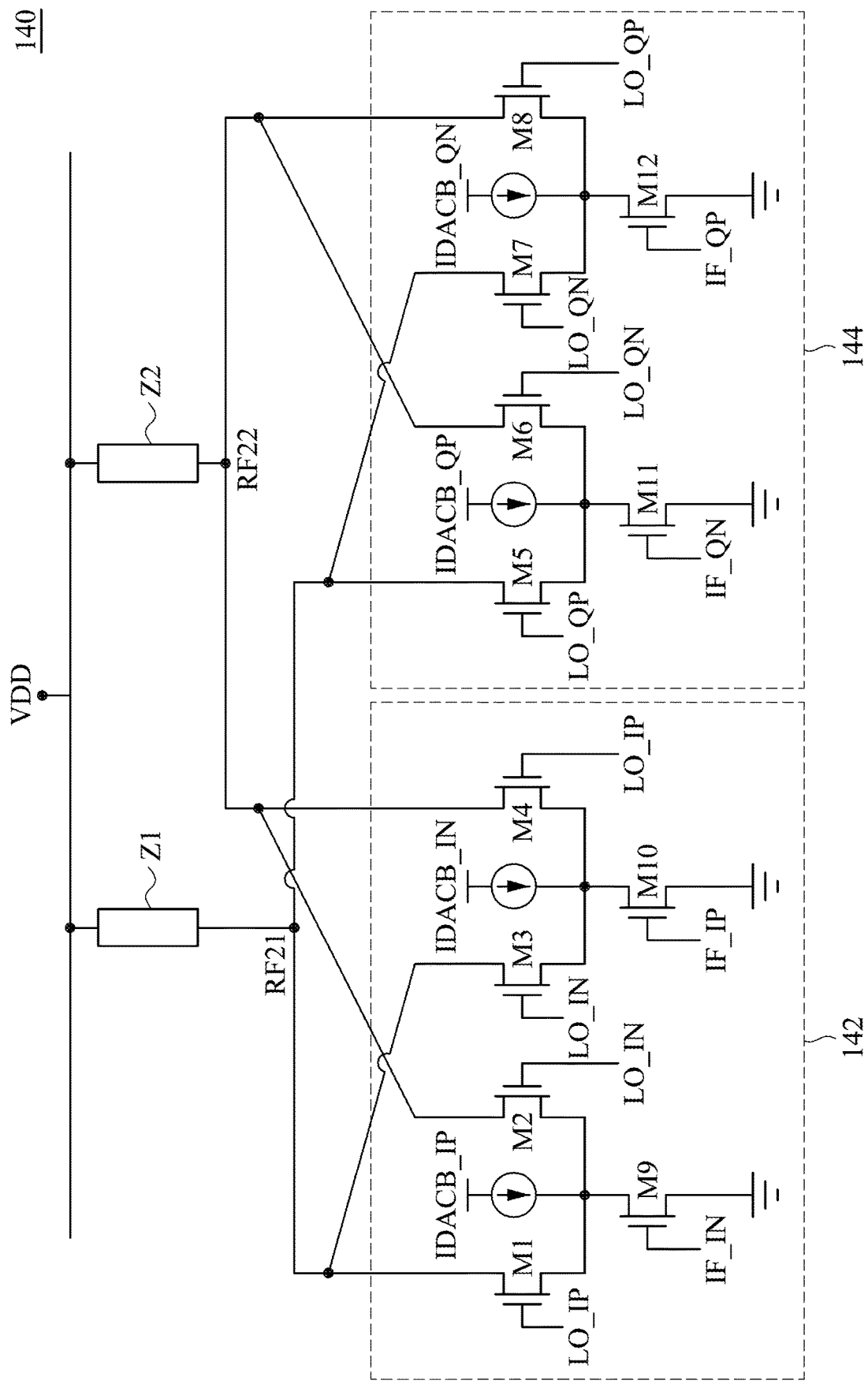
FIG. 5 is a schematic diagram of the RF modulator in the second calibration period in accordance with one embodiment of the present disclosure.

For the better understanding, reference is made to FIGS. 1-5. FIG. 3A is a schematic diagram of a flow chart of a calibration method 200 in accordance with one embodiment of the present disclosure. FIG. 3B is a schematic diagram of a flow chart of a step S230 of the calibration method 200 in FIG. 3A in accordance with one embodiment of the present disclosure. FIG. 4 is a schematic diagram of the transceiver 100 in a second calibration period in accordance with one embodiment of the present disclosure. FIG. 5 is a schematic diagram of the RF modulator 140 in the second calibration period in accordance with one embodiment of the present disclosure. As shown in FIG. 3A, the calibration method 200 includes steps S210, S220, S230 and S240.

In step S210, during a first calibration period, the control circuit controls the filter circuit to be connected to the RF modulator with a first phase sequence, and in response to the filter circuit to be connected to the RF modulator with the first phase sequence, the RF modulator outputs a first RF signal. Specifically, during the first calibration period, the control circuit 180 controls the switch circuit 130 to sequentially connect the positive in-phase terminal, the negative in-phase terminal, the positive quadrature terminal and the negative quadrature terminal included in the filter circuit 120 to the first input terminal, the second input terminal, the third input terminal and the fourth input terminal of the RF modulator 140, such that the filter circuit 120 is connected to the RF modulator 140 with the first phase sequence of "positive, negative, positive, negative", as shown in FIG. 1.

During the first calibration period, the transistor M9 is configured to receive the positive in-phase IF signal IF_IP, and the transistor M10 is configured to receive the negative in-phase IF signal IF_IN. The transistor M11 is configured to receive the positive quadrature IF signal IF_QP, and the transistor M12 is configured to receive the negative quadrature IF signal IF_QN. Meanwhile, an addition of the first RF signals RF11 and RF12 forms a first RF signal RF1. The first RF signal RF1 includes a sum of the first DC offset generated from the filter circuit 120 and the second DC offset generated from the RF modulator 140, as shown in FIG. 2. Correspondingly, during the first calibration period, the first RF signal RF1' detected by the control circuit 180 from the amplifier 160 also includes the sum of the first DC offset generated from the filter circuit 120 and the second DC offset generated from the RF modulator 140.

In step S240, during a second calibration period, the control circuit controls the filter circuit to be connected to the RF modulator with a second phase sequence, in response to the control circuit controls the filter circuit to be connected to the RF modulator with the second phase sequence, the RF circuit outputs a second RF signal. Specifically, during the second calibration period, the control circuit 180 controls the switch circuit 130 to sequentially connect the negative in-phase terminal, the positive in-phase terminal, the negative quadrature terminal and the positive quadrature terminal included in the filter circuit 120 to the first input terminal, the second input terminal, the third input terminal and the fourth input terminal included in the RF modulator 140, such that the filter circuit 120 is connected to the RF modulator 140 with the second phase sequence of "negative, positive, negative, positive", as shown in FIG. 4.

During the second calibration period, the transistor M9 is configured to receive the negative in-phase IF signal IF_IN, and the transistor M10 is configured to receive the positive in-phase IF signal IF_IP. The transistor M11 is configured to receive the negative quadrature IF signal IF_QN, and transistor M12 is configured to receive the positive quadrature IF signal IF_QP, as shown in FIG. 5.

Meanwhile, the second phase of "negative, positive, negative, positive" is inverted from the first phase of "positive, negative, positive, negative". In other word, since the positive in-phase IF signal IF_IP is inverted from the negative in-phase IF signal IF_IN, and the positive quadrature IF signal IF_QP is inverted from the negative quadrature IF signal IF_QN, a sum of the first RF signals RF21 and RF22 forms the second RF signal RF2 which includes a sum of an negative value of the first DC offset generated from the filter circuit 120 and a positive value of the second DC offset generated from the RF modulator 140. That is, the second RF signal RF2 also includes the second value (/DC noise) of a subtraction of the first DC offset generated from the filter circuit 120 and the second DC offset generated from the RF modulator 140.

In step S230, the first DC offset generated from the filter circuit and the second DC offset generated from the radio modulator are calculated by the control circuit according to the first RF signal and the second RF signal. Step S230 includes steps S232, S234 and S236, as shown in FIG. 3B.

In step S232, a first value of a sum of the first DC offset generated from the filter circuit and the second DC offset generated from the RF modulator is obtained from the first RF signal by the control circuit. In some embodiments, the first RF signal RF1 can be derived from the first RF signal RF1' according to a gain of the amplifier 160, which include a first value of a sum of the first DC offset and the second DC offset generated from the filter circuit 120 and the RF modulator 140, such that the control circuit 180 can obtain the first value of the sum of the first DC offset and the second DC offset from the first RF signal RF1.

In step S234, a second value of a subtraction of the first DC offset of the filter circuit and the second DC offset of the RF modulator is obtained from the second RF signal by the control circuit according to the second RF signal. In some embodiments, the second RF signal RF2 can be derived from the second RF signal RF2' according to the gain of the amplifier 160, which include a second value of a subtraction of the first DC offset and the second DC offset generated from the filter circuit 120 and the RF modulator 140, such that the control circuit 180 can obtain the second value of the subtraction of the first DC offset and the second DC offset from the second RF signal RF2.

In step, S236, the first DC offset and the second DC offset are calculated from the first value and the second value by the control circuit. Specifically, a system of linear equations of the first DC offset generated from the filter circuit 120 and the second DC offset generated from the RF modulator 140 can be established according to steps S232 and S234. For example, the first DC offset generated from the filter circuit 120 is expressed as "A", and the second DC offset generated from the RF modulator 140 is expressed as "B". The first value mentioned above is expressed as "C", and the second value mentioned above is expressed as "D". The system of linear equations can be expressed as follow.

$A+B=C$ $-A+B=D$

Therefore, the solution of system of linear equations is the first DC offset (A) generated from the filter circuit 120 and the second DC offset (B) generated from the RF modulator 140, such that the control circuit 180 can derive the first DC offset (A) generated from the filter circuit 120 and the second DC offset (B) generated from the RF modulator 140 according to the system of linear equations.

As a result, step S240 can be performed continuously, a first DC compensation circuit is controlled by the control circuit to compensate the first DC offset generated from the filter circuit, and a second SC compensation circuit is controlled by the control circuit to compensate the second DC offset generated from the RF modulator.

In some embodiments, the control circuit 180 can control the first DC compensation circuit 182 to generate at least one of the compensation currents IDCA, and add the at least one of the compensation currents IDCA to a corresponding one of the positive in-phase IF signal IF_IP, the negative in-phase IF signal IF_IN, the positive quadrature IF signal IF_QP and the negative quadrature IF signal IF_QN, such that the first DC offset generated by the filter circuit 120 can be cancelled, so as to compensate the first DC offset generated from the filter circuit 120.

Similarly, the control circuit 180 can control the second DC compensation circuit 184 to generate at least one of the compensation currents IDCB, such as, the compensation currents IDACB_IP, IDACB_IN, IDACB_QP and IDACB_Qn as shown in FIG. 2, and the compensation currents IDCB are respectively added to the first terminals (such as, source terminals) of the transistors M9-M12, such that the second DC offset of the RF modulator 140 can be cancelled, so as to compensate the second DC offset generated from the RF modulator 140.

Summary, the present disclosure utilizes the control circuit 180 to control the switch circuit 130 to change the phase sequence between the filter circuit 120 and the RF modulator 140, so as to generate the first RF signal RF1 at the first phase sequence and the second RF signal RF2 at the second phase sequence by the RF modulator. The system of linear equations for the first DC offset generated from the filter circuit 120 and the second DC offset generated from the RF modulator 140 can be established according to the first RF signal RF1 and the second RF signal RF2. Therefore, the solution of the system of linear equations can be considered as the values of the first DC offset generated from the filter circuit 120 and the second DC offset generated from the RF modulator 140, so as to perform the DC offset compensation operation to the filter circuit 120 and the RF modulator 140. Furthermore, the present disclosure utilizes the control circuit 180 and the switch circuit 130 to switch the connection path (phase sequence) between the different stages included in the transceiver 100, and detect the signal at the output terminal of the transceiver 100, such that the DC offsets generated by the different stages can be calculated and cancelled, respectively, so as to simplify the detection operation and the circuit architecture.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A transceiver, comprising:
    a Radio Frequency (RF) modulator;
    a filter circuit, connected to the RF modulator, and the filter circuit supplying a phase sequence to the RF modulator, and wherein the RF modulator outputs a RF signal according to the phase sequence;
    a control circuit, connected to the RF modulator and the filter circuit, wherein the control circuit is configured to:
    during a first calibration period, control the filter circuit to be connected to the RF modulator and supply to the RF modulator a first phase sequence, and wherein in response to the filter circuit being connected to the RF modulator and supplied with the first phase sequence, the RF modulator outputs a first RF signal;
    during a second calibration period, control the filter circuit to be connected to the RF modulator and supply a second phase sequence, and wherein in response to the filter circuit being connected to the RF modulator and supplied with the second phase sequence, the RF modulator outputs a second RF signal; and
    calculate a first Direct Current (DC) offset generated from the filter circuit according to the first RF signal and the second RF signal; and
    a first DC offset compensation circuit, connected to the filter circuit and the control circuit, wherein the control circuit is further configured to control the first DC offset compensation circuit to compensate the first DC offset generated from the filter circuit.

2. The transceiver of claim 1, wherein the control circuit is further configured to:
    obtain a first value of a sum of the first DC offset generated from the filter circuit and a second DC offset generated from the RF modulator according to the first RF signal; and
    obtain a second value of a subtraction of the first DC offset generated from the filter circuit and the second DC offset generated from the RF modulator according to the second RF signal.

3. The transceiver of claim 2, wherein the control circuit is further configured to establish a system of linear equations, wherein the system of linear equations is expressed as:

$$A+B=C$$

$$-A+B=D$$

wherein the first DC offset is expressed as A in the system of linear equations, wherein the second DC offset is expressed as B in the system of linear equations, wherein the first value is expressed as C in the system of linear equations, and wherein the second value is expressed as D in the system of linear equations.

4. The transceiver of claim 3, wherein the control circuit is further configured to calculate the first DC offset and the second DC offset from the system of linear equations.

5. The transceiver of claim 1, further comprising:
    a second DC compensation circuit, connected to the control circuit, wherein the control circuit is further configured to calculate a second DC offset generated from the RF modulator according to the first RF signal and the second RF signal, and wherein the control circuit is further configured to control the second DC compensation circuit to compensate the second DC offset generated from the RF modulator.

6. The transceiver of claim 1, further comprising:
    a switch circuit, electrically coupled between the RF modulator and the filter circuit, wherein the control circuit is further configured to:
    during the first calibration period, control the switch circuit to connect the filter circuit and the RF modulator and supply to the RF modulator the first phase sequence, and wherein in response to the filter circuit being connected to the RF modulator and supplied with the first phase sequence, the RF modulator outputs a first RF signal; and
    during the second calibration period, control the switch circuit to connect the filter circuit and the RF modulator and supply to the RF modulator the second phase sequence, and wherein in response to the filter circuit being connected to the RF modulator and supplied with the second phase sequence, the RF modulator outputs a second RF signal.

7. The transceiver of claim 6, wherein the filter circuit comprises a positive quadrature terminal, a negative quadrature terminal, a positive in-phase terminal and a negative in-phase terminal, and wherein the RF modulator comprises a first input terminal, a second input terminal, a third input terminal and a fourth input terminal, wherein the control circuit controls the switch circuit to:

during the first calibration period, sequentially connect the positive quadrature terminal, the negative quadrature terminal, the positive in-phase terminal and the negative in-phase terminal comprised in the filter circuit to the first input terminal, the second input terminal, the third input terminal and the fourth input terminal comprised in the RF modulator; and during the second calibration period, sequentially connect the negative quadrature terminal, the positive quadrature terminal, the negative in-phase terminal and the positive in-phase terminal comprised in the filter circuit to the first input terminal, the second input terminal, the third input terminal and the fourth input terminal comprised in the RF modulator.

8. The transceiver of claim 1, further comprising:
a digital to analog converting circuit, configured to generate a positive quadrature base signal, a negative quadrature base signal, a positive in-phase base signal and a negative in-phase base signal to the filter circuit.

9. The transceiver of claim 8, further comprising:
a digital signal processor, configured to generate an in-phase digital signal and an quadrature digital signal to the digital to analog converting circuit.

10. The transceiver of claim 1, further comprising:
a local oscillator, configured to provide a quadrature local oscillator signal and an in-phase local oscillator signal to the RF modulator.

11. A calibration method, comprising:
during a first calibration period, controlling a filter circuit to be connected to a Radio Frequency (RF) modulator and supplying the RF modulator a first phase sequence by a control circuit, and in response to the filter circuit being connected to the RF modulator and supplied with the first phase sequence, outputting a first RF signal from the RF modulator;

during a second calibration period, controlling the filter circuit to be connected to the RF modulator and supplying the RF modulator a second phase sequence by the control circuit, and in response to the filter circuit being connected to the RF modulator and supplied with the second phase sequence, outputting a second RF signal from the RF modulator;

calculating a first Direct Current (DC) offset generated from the filter circuit by the control circuit according to the first RF signal and the second RF signal; and controlling a first DC compensation circuit to compensate the first DC offset generated from the filter circuit by the control circuit.

12. The calibration method of claim 11, further comprising:
obtaining a first value of a sum of the first DC offset generated from the filter circuit and a second DC offset generated from the RF modulator according to the first RF signal by the control circuit; and obtaining a second value of a subtraction of the first DC offset generated from the filter circuit and the second DC offset generated from the RF modulator according to the second RF signal by the control circuit.

13. The calibration method of claim 12, further comprising:
establishing a system of linear equations by the control circuit, wherein the system of linear equations is expressed as:

$$A+B=C$$

$$-A+B=D$$

wherein the first DC offset is expressed as A in the system of linear equations, wherein the second DC offset is expressed as B in the system of linear equations, wherein the first value is expressed as C in the system of linear equations, and wherein the second value is expressed as D in the system of linear equations.

14. The calibration method of claim 13, further comprising:
calculating the first DC offset and the second DC offset from the system of linear equations by the control circuit.

15. The calibration method of claim 11, further comprising:
calculating a second DC offset generated from the RF modulator according to the first RF signal and the second RF signal by the control circuit; and controlling a second DC compensation circuit to compensate the second DC offset generated from the RF modulator by the control circuit.

16. The calibration method of claim 11, further comprising:
during the first calibration period, controlling a switch circuit, electrically coupled between the RF modulator and the filter circuit, to connect the filter circuit and the RF modulator and supply the RF modulator the first phase sequence by the control circuit, and in response to the filter circuit being connected to the RF modulator and supplied with the first phase sequence, outputting a first RF signal from the RF modulator; and during the second calibration period, controlling the switch circuit to connect the filter circuit and the RF modulator and supply the RF modulator the second phase sequence, and in response to the filter circuit being connected to the RF modulator and supplied with the second phase sequence, outputting a second RF signal from the RF modulator.

17. The calibration method of claim 16, wherein the filter circuit comprises a positive quadrature terminal, a negative quadrature terminal, a positive in-phase terminal and a negative in-phase terminal, and wherein the RF modulator comprises a first input terminal, a second input terminal, a third input terminal and a fourth input terminal, wherein the calibration method further comprising:

during the first calibration period, controlling the switch circuit, by the control circuit, to sequentially connect the positive quadrature terminal, the negative quadrature terminal, the positive in-phase terminal and the negative in-phase terminal comprised in the filter circuit to the first input terminal, the second input terminal, the third input terminal and the fourth input terminal comprised in the RF modulator; and during the second calibration period, controlling the switch circuit, by the control circuit, to sequentially connect the negative quadrature terminal, the positive quadrature terminal, the negative in-phase terminal and the positive in-phase terminal comprised in the filter circuit to the first input terminal, the second input terminal, the third input terminal and the fourth input terminal comprised in the RF modulator.

18. The calibration method of claim 11, further comprising:
generating a positive quadrature base signal, a negative quadrature base signal, a positive in-phase base signal and a negative in-phase base signal, by a digital to analog converting circuit, to the filter circuit.

19. The calibration method of claim 18, further comprising:
   generating an in-phase digital signal and an quadrature digital signal, by a digital signal processor, to the digital to analog converting circuit.

20. The calibration method of claim 11, further comprising:
   providing a quadrature local oscillator signal and an in-phase local oscillator signal, by a local oscillator, to the RF modulator.

* * * * *